(12) United States Patent
Jung et al.

(10) Patent No.: US 7,952,118 B2
(45) Date of Patent: May 31, 2011

(54) SEMICONDUCTOR DEVICE HAVING DIFFERENT METAL GATE STRUCTURES

(75) Inventors: Hyung-suk Jung, Suwon-si (KR);
Jong-ho Lee, Hwaseong-si (KR);
Sung-kee Han, Seongnam-si (KR);
Ha-jin Lim, Gwangjin-gu (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 424 days.

(21) Appl. No.: 11/946,153

(22) Filed: Nov. 28, 2007

(65) Prior Publication Data

US 2008/0067606 A1   Mar. 20, 2008

Related U.S. Application Data

(63) Continuation-in-part of application No. 11/432,717, filed on May 12, 2006, now abandoned, which is a continuation-in-part of application No. 10/930,943, filed on Sep. 1, 2004, now abandoned.

(30) Foreign Application Priority Data

Nov. 12, 2003 (KR) .......... 10-2003-0079908
Aug. 8, 2005 (KR) .......... 10-2005-0072331
Jan. 3, 2007 (KR) .......... 10-2007-0000684

(51) Int. Cl.
H01L 29/78 (2006.01)
(52) U.S. Cl. ........ 257/206; 257/204; 257/368; 257/369; 257/E27.064; 257/E27.067
(58) Field of Classification Search .................. 257/206, 257/351, 369, 574, E27.064, E27.057
See application file for complete search history.

(56) References Cited

U.S. PATENT DOCUMENTS

| | | | | |
|---|---|---|---|---|
| 6,027,961 A * | 2/2000 | Maiti et al. | | 438/199 |
| 6,033,983 A * | 3/2000 | Lee et al. | | 438/637 |
| 6,084,279 A * | 7/2000 | Nguyen et al. | | 257/412 |
| 6,291,282 B1 * | 9/2001 | Wilk et al. | | 438/203 |
| 6,444,512 B1 * | 9/2002 | Madhukar et al. | | 438/203 |
| 6,528,858 B1 | 3/2003 | Yu et al. | | |
| 6,538,278 B1 * | 3/2003 | Chau | | 257/324 |
| 6,552,386 B1 * | 4/2003 | Wu | | 257/317 |
| 6,563,183 B1 | 5/2003 | En et al. | | |
| 6,657,268 B2 * | 12/2003 | Besser et al. | | 257/410 |
| 6,696,333 B1 * | 2/2004 | Zheng et al. | | 438/230 |
| 6,765,258 B1 * | 7/2004 | Wu | | 257/315 |
| 6,794,234 B2 * | 9/2004 | Polishchuk et al. | | 438/199 |
| 6,794,281 B2 * | 9/2004 | Madhukar et al. | | 438/592 |
| 6,815,285 B2 * | 11/2004 | Choi et al. | | 438/231 |

(Continued)

FOREIGN PATENT DOCUMENTS

EP 1531496 A2 5/2005

(Continued)

*Primary Examiner* — Leonardo Andújar
*Assistant Examiner* — William Harriston
(74) *Attorney, Agent, or Firm* — Volentine & Whitt, P.L.L.C.

(57) ABSTRACT

A semiconductor includes a channel region in a semiconductor substrate, a gate dielectric film on the channel region, and a gate on the gate dielectric film. The gate includes a doped metal nitride film, formed from a nitride of a first metal and doped with a second metal which is different from the first metal, and a conductive polysilicon layer formed on the doped metal nitride film. The gate may further include a metal containing capping layer interposed between the doped metal nitride film and the conductive polysilicon layer.

8 Claims, 9 Drawing Sheets

U.S. PATENT DOCUMENTS

| | | | |
|---|---|---|---|
| 6,881,631 B2 * | 4/2005 | Saito et al. | 438/283 |
| 6,894,353 B2 * | 5/2005 | Samavedam et al. | 257/365 |
| 7,045,406 B2 * | 5/2006 | Huotari et al. | 438/198 |
| 7,056,776 B2 * | 6/2006 | Park et al. | 438/157 |
| 7,081,409 B2 * | 7/2006 | Kang et al. | 438/681 |
| 7,105,891 B2 * | 9/2006 | Visokay et al. | 257/338 |
| 7,135,393 B2 * | 11/2006 | Tagawa | 438/519 |
| 7,193,280 B2 * | 3/2007 | Li et al. | 257/410 |
| 7,205,617 B2 * | 4/2007 | Ohta et al. | 257/374 |
| 7,332,433 B2 * | 2/2008 | Choi et al. | 438/685 |
| 7,602,030 B2 * | 10/2009 | Ahn et al. | 257/411 |
| 2002/0006674 A1 * | 1/2002 | Ma et al. | 438/3 |
| 2005/0056900 A1 * | 3/2005 | Wang et al. | 257/410 |
| 2009/0114996 A1 * | 5/2009 | Inumiya et al. | 257/369 |

FOREIGN PATENT DOCUMENTS

| | | |
|---|---|---|
| JP | 2004-241733 | 8/2004 |
| KR | 102004003211 A | 1/2004 |

* cited by examiner

SEMICONDUCTOR DEVICE HAVING DIFFERENT METAL GATE STRUCTURES

CROSS-REFERENCE TO RELATED PATENT APPLICATIONS

This is a continuation-in-part of U.S. patent application Ser. No. 11/432,717, filed on May 12, 2006, which is a continuation-in-part of U.S. patent application Ser. No. 10/930,943, filed on Sep. 1, 2004, the subject matters of which are hereby incorporated by reference.

In addition, a claim of priority is made to Korean Patent Application No. 10-2007-0000684, filed on Jan. 3, 2007, the subject matter of which is hereby incorporated by reference. Also, a claim of priority is made to Korean Patent Application Nos. 10-2005-0072331 and 2003-0079908, filed on Aug. 8, 2005 and Nov. 12, 2003, respectively, in the Korean Intellectual Property Office, the subject matters of which are hereby incorporated by reference.

BACKGROUND OF THE INVENTION

1. Field of the Invention

The present invention relates to a semiconductor device and a method of manufacturing the same, and more particularly to a semiconductor device having different metal gate structures, and a method of manufacturing the same.

2. Description of the Related Art

Conventional transistor devices, such as metal-oxide-semiconductor (MOS) devices, are characterized by a gate dielectric of silicon oxide or silicon oxynitride interposed between a gate electrode and a channel region. The performance of such devices can be improved by increasing the capacitance between the gate electrode and channel region. One common method by which the capacitance has been increased is to decrease the thickness of the gate dielectric layers. However, degraded electrical characteristics can result from direct tunneling to the channel region in cases where the gate dielectric of silicon oxide or silicon oxynitride is made too thin. The result is increased leakage current and increased power consumption.

For example, consistent with increased integration of semiconductor devices and decreased feature sizes of MOS Field Effect Transistors (MOSFETs), gate lengths and underlying channel lengths are decreasing. Also, the thickness of the gate dielectric film has been decreased in order to increase capacitance between the gate and the channel, while maintaining the operational characteristics of a transistor. However, the typical gate dielectric film, composed of silicon oxide or silicon oxide nitride, has physical limitations related to thickness due to electrical properties, so reduced thickness may compromise reliability of the gate dielectric film. As stated above, an excessively thin silicon oxide film increases a direct tunneling current and thus the leakage current between the gate and the channel region, as well as electrical dissipation. Thus, reducing the thickness of a gate dielectric film formed from silicon oxide or silicon oxide nitride is limited.

Accordingly, methods have been sought to reduce leakage current while achieving a high gate capacitance. One method investigated by the industry is the use of materials having a high dielectric constant (high-k or high-$\in$) for the gate dielectric layer. Generally, gate capacitance (C) is proportional to permittivity ($\in$) and inversely proportional to thickness (t) (i.e., $C=\in A/t$, where A is a constant). Thus, an increase in thickness (t) (e.g., to 40 angstroms or more) for reducing leakage current can be offset by high permittivity ($\in$).

However, the use of high-k dielectrics for gate dielectric layers suffers drawbacks. This is at least partly because high dielectric materials contain a greater number of bulk traps and interface traps than thermally grown silicon oxides. These traps adversely affect the threshold voltage (Vt) characteristics of PMOS and NMOS devices. As a result, various methods of channel engineering, such as ion implantation, have been proposed in an effort to realize a target threshold voltage for devices utilizing a high-k material as a gate dielectric layer. However, such methods also cause problems such as an increase in drain induced barrier lowering (DIBL) and a decrease in a drain-to-source breakdown voltage (BVDS). Furthermore, the n-channel MOSFETs and p-channel MOSFETs of CMOS transistors generally require different gate dielectric threshold voltage characteristics, thus limiting the effective use of channel engineering techniques.

Much research is being concentrated on high-k material, which decreases the leakage current between the gate electrode and the channel region, while maintaining a thin equivalent oxide film thickness, to replace the typical silicon oxide or silicon oxide nitride. When a high-k material is used in the gate dielectric film of a MOSFET semiconductor device, electron mobility in the channel region of the semiconductor substrate under the gate dielectric film decreases, due to the bulk traps and the interface traps in the interface of the semiconductor substrate with the gate dielectric film. Moreover, the threshold voltage Vt is excessively high compared with the conventional gate dielectric film composed of silicon oxide or silicon oxide nitride. More particularly, when a gate electrode composed of a polysilicon film is formed on the gate high-k dielectric film, a gate depletion phenomenon and diffusion of dopant from the gate electrode to the gate dielectric film degrade the reliability of the semiconductor device.

SUMMARY OF THE INVENTION

According to an aspect of the present invention, there is provided a semiconductor device including a channel region in a semiconductor substrate, a gate dielectric film on the channel region, and a gate formed on the gate dielectric film. The gate includes a doped metal nitride film, formed from a nitride of a first metal and doped with a second metal which is different from the first metal, and a conductive polysilicon layer formed on the doped metal nitride film.

The gate may further include a metal containing capping layer interposed between the doped metal nitride film and the conductive polysilicon layer. The metal containing capping layer may include a metal, a metal oxide or a metal nitride, or an aluminum oxide or an aluminum nitride.

The gate dielectric film may include an interface layer positioned directly on the channel region and including a low dielectric constant film having a first dielectric constant, and a high dielectric constant film positioned on the interface layer and having a second dielectric constant greater than the first dielectric constant. The interface layer includes at least one of a silicon oxide film, a silicon oxynitride film and a silicate film. The high dielectric constant film may be formed from $HfO_2$, $Al_2O_3$ or a combination including these materials.

The doped metal nitride film may be an aluminum-doped TaN film. For example, the doped metal nitride film may be a TaN film doped with a first element including aluminum and a second element including at least one of oxygen and nitride. Also, the doped metal nitride film may be a TaN film doped with a lanthanum-based element. The doped metal nitride film may be a TaN film doped with a first element including a lanthanum-based material and a second element including at least one of oxygen and nitride.

According to another aspect of the present invention, there is provided a semiconductor device including first and second MOS transistors. The first MOS transistor includes a first channel region of a first conductivity type on a semiconductor substrate, a first gate dielectric film on the first channel region, a first gate including a first metal nitride film on the first gate dielectric film, and a first conductive polysilicon layer. The second MOS transistor includes a second channel region of a second conductivity type on the semiconductor substrate, a second gate dielectric film on the second channel region, a second gate including a second metal nitride film having a composition different from the first metal nitride film on the second gate dielectric film, and a second conductive polysilicon layer.

The first MOS transistor may be a PMOS transistor and the second MOS transistor may be an NMOS transistor, and the first gate dielectric film and the second gate dielectric film may have the same structure. Also, the first gate dielectric film and the second gate dielectric film may each include an interface layer positioned directly on the channel region, and having a low dielectric constant film having a first dielectric constant, and a high dielectric constant film on the interface layer, and having a second dielectric constant greater than the first dielectric constant.

The interface layer may be a silicon oxide film, a silicon oxynitride film, a silicate film or combinations of these films, and the high dielectric constant film may be formed from $HfO_2$, $Al_2O_3$ or combinations of these materials.

The first metal nitride film may be a TaN film doped with a first element including aluminum and a second element including at least one of oxygen and nitride. Also, the first gate may further include a metal containing capping film interposed between the first metal nitride film and the conductive polysilicon layer. The metal containing capping layer may include metal, metal oxide or metal nitride, or the metal containing capping layer may include oxide aluminum or nitride aluminum.

The second metal nitride film may be an undoped TaN film. Alternatively, the second metal nitride film may be a TaN film doped with a lanthanum-based element. The first MOS transistor may be a PMOS transistor and the second MOS transistor may be an NMOS transistor, and the second metal nitride film may be a TaN film doped with a lanthanum-based element. The first metal nitride film may be a TaN film doped with a first element comprising aluminum and a second element comprising at least one of oxygen and nitride. Also, the first metal nitride film may be an undoped TaN film.

According to another aspect of the present invention, there is provided a method of manufacturing a semiconductor device. The method includes forming a gate dielectric film on a semiconductor substrate; forming a metal nitride film including a first metal on the gate dielectric film; and forming a capping layer including a second metal different from the first metal on the metal nitride film. A doped metal nitride film is formed by thermally treating a resultant structure including a stacked structure of the metal nitride film and the capping layer, doping the metal nitride film with the second metal. A conductive polysilicon layer is formed on the doped metal nitride film to form a gate including the doped metal nitride film and the conductive polysilicon layer.

The metal nitride film may be TaN, and the second metal may be an aluminum- or lanthanum-based metal. The capping layer may be an $Al_2O_3$ film or a lanthanum-based metal containing film.

In order to form the doped metal nitride film, the resultant structure including the stacked structure of the metal nitride film and the capping layer may be thermally treated at a temperature of 750°~950° C. The thermal treatment may be performed at an ambient of at least one gas from the group consisting of $N_2$, NO, $N_2O$, $NH_3$ and $O_2$.

After forming the doped metal nitride film and before forming the conductive polysilicon layer, the capping layer left on the doped metal nitride film may be removed to expose the doped metal nitride film. The high dielectric constant film may include $HfO_2$.

Forming of the gate dielectric film may include forming an interface layer comprising a low dielectric constant film having a first dielectric constant on the semiconductor substrate, and forming a high dielectric constant film having a second dielectric constant greater than the first dielectric constant on the interface layer. The interface layer may be a silicon oxide film, a silicon oxynitride film, a silicate film or combinations of these films.

According to another aspect of the present invention, there is provided a method of manufacturing a semiconductor device. The method includes preparing a semiconductor substrate including a first MOS region having a channel of a first conductive type and a second MOS region having a channel of a second conductivity type opposite to the first conductivity type; forming a first gate dielectric film and a second gate dielectric film on the first MOS region and the second MOS region, respectively; and forming a metal nitride film including the first metal respectively on the first gate dielectric film and the second gate dielectric film. A capping layer is formed on the first gate dielectric film, the capping layer including a second metal different from the first metal only in the first MOS region out of the first MOS region and the second MOS region. A doped metal nitride film is formed by thermally treating the stacked structure of the metal nitride film and the capping layer, thereby doping the metal nitride film with the second metal only in the first MOS region. A conductive polysilicon layer is formed on the doped metal nitride film of the first MOS region and the metal nitride film of the second MOS region. The first gate dielectric film and the second gate dielectric film may have the same structure.

Forming the capping layer only in the first MOS region may include forming the capping layer on the metal nitride film in each of the first MOS region and the second MOS region, annealing the capping layer, and removing the annealed capping layer in the second MOS region to leave the annealed capping layer only in the first MOS region. The thermal treatment of the stacked structure of the metal nitride film and the capping layer to form the doped metal nitride film may be performed at a higher temperature and for a longer time than the annealing of the capping layer. For example, thermal treatment of the stacked structure of the metal nitride film and the capping layer to form the doped metal nitride film may be performed at a temperature of 750°~950° C. under an ambient of at least one gas from the group consisting of $N_2$, NO, $N_2O$, $NH_3$ and $O_2$. The annealing of the capping layer may be performed at a temperature of 550°~750° C. under an ambient of at least one gas selected from the group of $N_2$, NO, $N_2O$, $NH_3$ and $O_2$.

The method may further include wet etching the annealed capping layer exposed in the second MOS region to remove the annealed capping layer in the second MOS region while the annealed capping layer in the first MOS region is covered with a photoresist pattern and/or a hard mask layer. The photoresist pattern left in the second MOS region is removed. A cleansing solution including hydrogen fluoride (HF) may be used to remove the annealed capping layer in the second MOS region. The hard mask layer may be a silicon oxide film formed by atomic layer deposition (ALD). The thermal treatment of the resultant structure may include the stacked structure of the metal nitride film and the capping layer may be performed when the hard mask layer is left in the first MOS region.

The method may further include removing the capping layer and the hard mask layer remaining on the doped metal nitride film after forming the doped metal nitride film. The capping layer and the hard mask layer remaining on the doped metal nitride film may be removed by wet etching using a cleansing solution including hydrofluoric acid or HF.

According to the various aspects of the present invention, a CMOS transistor including a gate dielectric film having a high dielectric constant film, the gate electrode structure may be formed differently according to the channel types of the transistors, thereby simply attaining the target threshold voltages of an NMOS transistor and an PMOS transistor. A portion of the gate electrode contacting the gate dielectric film may be formed of the metal nitride film to address the problems dopant intrusion in a PMOS region, as well as gate depletion in an NMOS region and the PMOS region. Further, the metal nitride film of the gate electrode may be doped with a different metal than that of the metal nitride film, so that the gate electrode having different work functions according to the channel types of the transistors can be embodied, and appropriate threshold voltages (Vt) can be easily obtained according to the channel types of the transistors.

BRIEF DESCRIPTION OF THE DRAWINGS

The embodiments of the present invention will be described with reference to the attached drawings, in which.

DETAILED DESCRIPTION OF THE EMBODIMENTS

Figure 1:
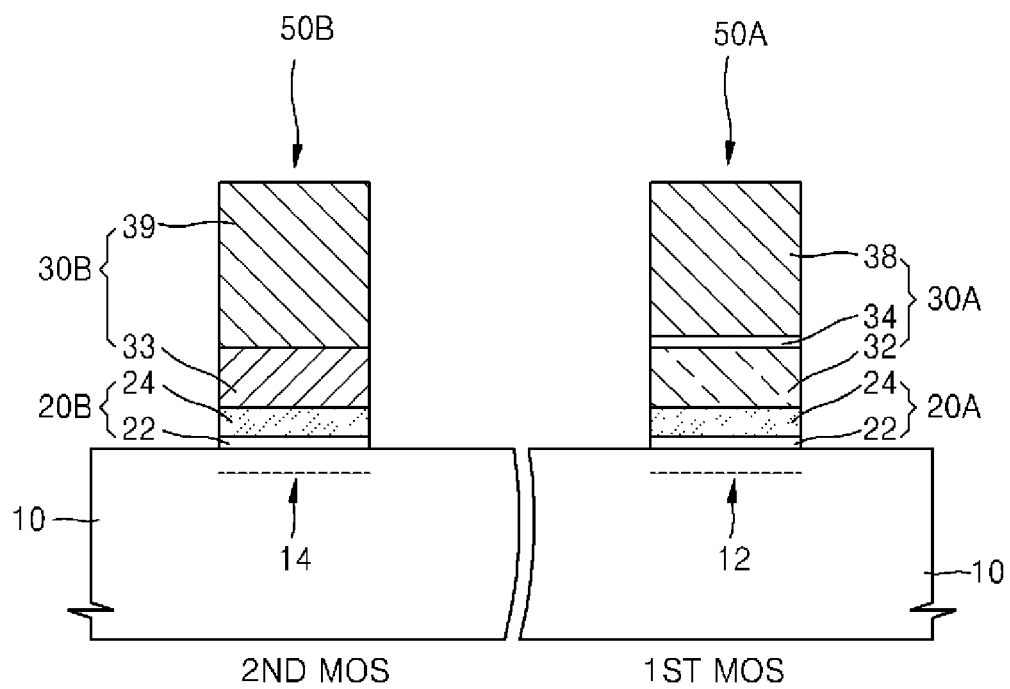
FIG. 1 is a sectional view illustrating a semiconductor device, according to an exemplary embodiment of the present invention.

The present invention will now be described more fully with reference to the accompanying drawings, in which exemplary embodiments of the invention are shown. The invention, however, may be embodied in various different forms, and should not be construed as being limited only to the illustrated embodiments. Rather, these embodiments are provided as examples, to convey the concept of the invention to one skilled in the art. Accordingly, known processes, elements, and techniques are not described with respect to some of the embodiments of the present invention. In the drawings, the thicknesses of layers and regions are exaggerated for clarity. Also, throughout the drawings and written description, like reference numerals will be used to refer to like or similar elements.

FIG. 1 is a sectional view illustrating a main portion of a semiconductor device, according to an illustrative embodiment of the present invention.

Referring to FIG. 1, a semiconductor device 60 has a semiconductor substrate 10, including a first MOS region 1ST MOS, in which a first MOS transistor is later formed, and a second MOS region 2ND MOS, in which a second MOS transistor is later formed. The first and second MOS transistors have channel types of opposite conductivity types. In the semiconductor substrate 10, a first gate stack structure 50A of the first MOS transistor is located on the first MOS region 1ST MOS, and a second gate stack structure 50B of the second MOS transistor is located on the second MOS region 2ND MOS.

The first gate stack structure 50A includes a first gate dielectric film 20A located on a channel region 12 of a first conductivity type formed in the semiconductor substrate 10. A first gate 30A is located on the first gate dielectric film 20A.

The second gate stack structure 50B includes a second gate dielectric film 20B located on a channel region 14 of a second conductivity type formed in the semiconductor substrate 10. A second gate 30B is located on the second gate dielectric film 20B.

In the first MOS transistor and the second MOS transistor, each of the first gate dielectric film 20A and the second gate dielectric film 20B may include an interface layer 22 formed immediately on the channel region 12 of the first conductivity type and the channel region 14 of the second conductivity type, respectively. The interface layers 22 have a first dielectric constant. Additionally, high-k films 24 having a second dielectric constant greater than the first dielectric constant may be formed on the interface layers 22. For example, the interface layers 22 may be formed from a silicon oxide film, a silicon oxide nitride film, a silicate film or combinations of these films. Also, the high-k film 24 may be composed of $HfO_2$, $Al_2O_3$, or combinations of these materials. In the first gate 30A and the second gate 30B, the first gate dielectric film 20A and the second gate dielectric film 20B may have identical structures.

In the first MOS transistor, the first gate 30A includes a doped first metal nitride film 32, a metal containing capping layer 34 and a first conductive polysilicon layer 38.

When the first MOS transistor is a PMOS transistor, the doped first metal nitride film 32 may be a TaN film doped with a first element composed of aluminum (Al) and at least one second element, such as oxygen (O) or nitrogen (N). When the first MOS transistor is an NMOS transistor, the doped first metal nitride film 32 may be a TaN film doped with a first element composed of a Lanthanum (La)-based element, such as Ce, Pr, Nd, Gd, Tb, Dy, Er and Eu, and at least one second element, such as O or N. In various embodiments, when the first MOS transistor is a PMOS or NMOS transistor, the second element of the dopant within the doped first metal nitride film 32 may be omitted.

The metal containing capping layer 34 may be formed from a metal, metal oxide or metal nitride. For example, when the first MOS transistor is a PMOS transistor, the metal containing capping layer 34 may include oxide aluminum or nitride aluminum. In various embodiments, the metal containing capping layer 34 may be omitted.

When the first MOS transistor is a PMOS transistor, the first conductive polysilicon layer 38 may be a polysilicon layer doped with a P-type impurity. When the first MOS transistor is an NMOS transistor, the first conductive polysilicon layer 38 may be a polysilicon layer doped with an N-type impurity.

In the second MOS transistor, the second gate 30B includes a second metal nitride film 33, which has a composition different from the doped first metal nitride film 32 of the first MOS transistor, and a second conductive polysilicon layer 39.

The second metal nitride film 33 may be an undoped TaN film, for example. Otherwise, when the first MOS transistor is a PMOS transistor, and the second MOS transistor is an NMOS transistor, the doped first metal nitride film 32 may be the TaN film doped with a first element including Al and at least one second element, such as O or N. Also, the second metal nitride film 33 may be a TaN film doped with a first element including a La-based element and at least one second element, such as O or N. In various embodiments, the second element of the dopants included in the doped first metal nitride film 32 and/or the second metal nitride film 33 may be omitted.

When the second MOS transistor is a PMOS transistor, the second conductive polysilicon layer 39 may be a polysilicon layer doped with p-type impurity. When the second MOS transistor is an NMOS transistor, the second conductive polysilicon layer 39 may be a polysilicon layer doped with an n-type impurity.

FIGS. 2A through 2K are sectional views illustrating a method of manufacturing a semiconductor device according to a first illustrative embodiment of the present invention.

Figure 2A:
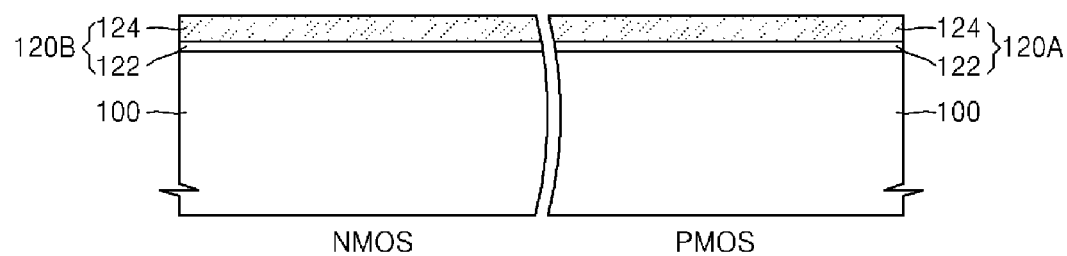
FIGS. 2A through 2K are sectional views illustrating a method of manufacturing a semiconductor device, according to a first exemplary embodiment of the present invention.

Referring to FIG. 2A, a semiconductor substrate 100, e.g., a silicon substrate, is prepared. The semiconductor substrate 100 includes an NMOS region NMOS where an n-channel MOS transistor will be formed and a PMOS region PMOS where a p-channel MOS transistor will be formed.

An interface layer 122 is formed in the NMOS region and the PMOS region on the semiconductor substrate 100, to a thickness of 0.2~15 Å or less. The interface layer 122 prevents a poor interfacial surface from forming between the semiconductor substrate 100 and a high-k film that will be formed on the interface layer 122 in subsequent processing. The interface layer 122 may be a low dielectric constant material layer having a dielectric constant of about 9 or less, e.g., a silicon oxide film with a dielectric constant of about 4 or a silicon oxynitride film with a dielectric constant of about 4~8, according to contents of oxygen atoms and nitride atoms. The interface layer 122 may also be a silicate film, or combinations of the films identified above. In one illustrative embodiment, the method of forming the interface layer 122 may include cleaning the semiconductor substrate 100 using ozone gas or ozone water, for example.

A high-k film 124 is formed on the interface layer 122 in the NMOS region and the PMOS region. The high-k film 124 may be formed from $HfO_2$, $Al_2O_3$ or combinations of these materials. The high-k film 124 may have a thickness within the range of 0.2~50 Å according to the kind of device to be formed. More particularly, the high-k film 124 may have a thickness of 5~50 Å. The high-k film 124 may be formed by chemical vapor deposition (CVD) or atomic layer deposition (ALD), for example.

In order to form the high-k film 124 of $HfO_2$ by CVD, an Hf source material including $HfCl_4$, $Hf(OtBu)_4$, $Hf(NEtMe)_4$, $Hf(MMP)_4$, $Hf(NEt_2)_4$ or $Hf(NMe_2)_4$, and an O source material including $O_2$, $O_3$ or oxygen radical, are used to perform deposition under a pressure condition of 1~5 Torr at a temperature of 400°~500° C. When the $HfO_2$ film is formed by ALD, for example, a metal organic precursor, including $HfCl_4$, $Hf(OtBu)_4$, $Hf(NEtMe)_4$, $Hf(MMP)_4$, $Hf(NEt_2)_4$ or $Hf(NMe_2)_4$, is used as the Hf source, and $H_2O$, $H_2O_2$, an alcohol having —OH radical, $O_3$ or $O_2$ plasma is used as the O source to perform deposition under a pressure condition of 0.1~5 Torr at a temperature of 150°~500° C. Thus, depositing and purging are repeated until the $HfO_2$ film having a desired thickness is obtained. Forming the $HfO_2$ film by ALD allows for low temperature deposition, good step coverage and easy thickness control.

When the high-k film 124 is formed from the $Al_2O_3$ film, CVD or ALD may be used to form the $Al_2O_3$ film. In order to form the high-k film 124 of $Al_2O_3$ by ALD, deposition is performed using trimethyl aluminum (TMA) as a first reaction material and $O_3$ as a second reaction material under a pressure of 0.1~5 Torr at a temperature of 200°~500° C. Thus, depositing and purging may be repeated until a desired thickness of the $Al_2O_3$ film is obtained. According to various alternatives, in addition to TMA as the first reaction material for the $Al_2O_3$ film, $AlCl_3$, $AlH_3N(CH_3)_3$, $C_6H_{15}AlO$, $(C_4H_9)_2AlH$, $(CH_3)_2AlCl$, $(C_2H_5)_3Al$ or $(C_4H_9)_3Al$ may be used. Also, an activated oxidizer such as $H_2O$, $H_2O_2$ or plasma $N_2O$ and plasma $O_2$ can be used as the second reaction material. In particular, when $O_3$ is used as the second reaction material, subsequent annealing can be omitted or a thermal budget of subsequent annealing can be minimized.

In the PMOS region and the NMOS region of the semiconductor substrate 100, each of the first gate dielectric film 120A and the second gate dielectric film 120B include the interface layer 122 and the high-k film 124.

Figure 2B:
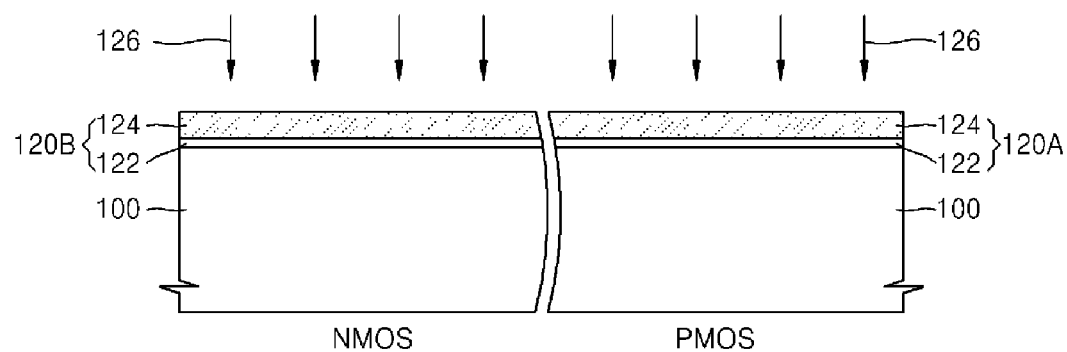

Referring to FIG. 2B, the high-k film 124 is annealed under an ambient 126 of a gas, such as $N_2$, NO, $N_2O$, $NH_3$, $O_2$ or combinations of these gases. The annealing process thereby makes the high-k film 124 more dense.

The gas ambient 126 used in the annealing process may contain nitrogen atoms, for example. By annealing the high-k film 124 under a gas ambient 126 containing nitrogen atoms, the high-k film 124 is subjected to nitridation. However, the embodiments of the present invention are not limited to a gas ambient 126 containing nitrogen atoms. Alternatively, the annealing may be performed under a vacuum ambient with no supply of gas, to make the high-k film 124 more dense. Also, in various embodiments, the annealing of the high-k film 124 described with reference to FIG. 2B need not be performed.

Figure 2C:
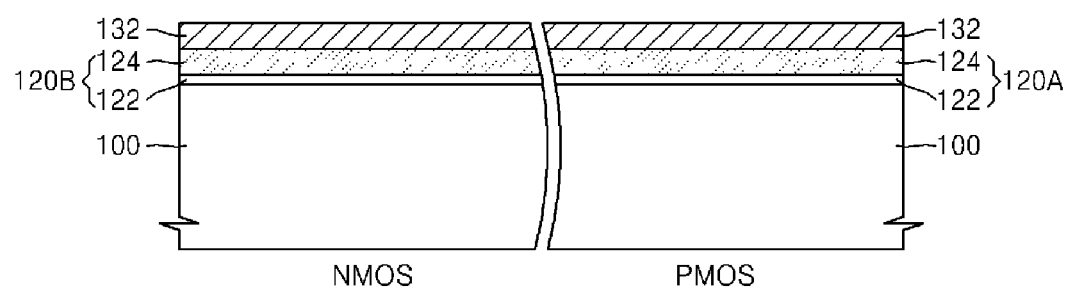

Referring to FIG. 2C, a metal nitride film 132 is formed on each of the first gate dielectric film 120A and the second gate dielectric film 120B in the PMOS region and the NMOS region, respectively, of the semiconductor substrate 100. A thickness of the metal nitride film 132 may be diverse, e.g., within the range of 1~200 Å, based on desired device dimensions. The metal nitride film 132 may be formed from a material including at least one metal atom, such as W, Mo, Ti, Ta, Al, Hf, Zr, Si and Al, and nitrogen atoms. Furthermore, the metal nitride film 132 may be formed from TaN.

The metal nitride film 132 may be thermally treated at a temperature of 450°~1050° C. In this case, thermal treatment may be performed under a gas ambient of $N_2$, NO, $N_2O$, $NH_3$, $O_2$, or combinations of these gases.

Figure 2D:
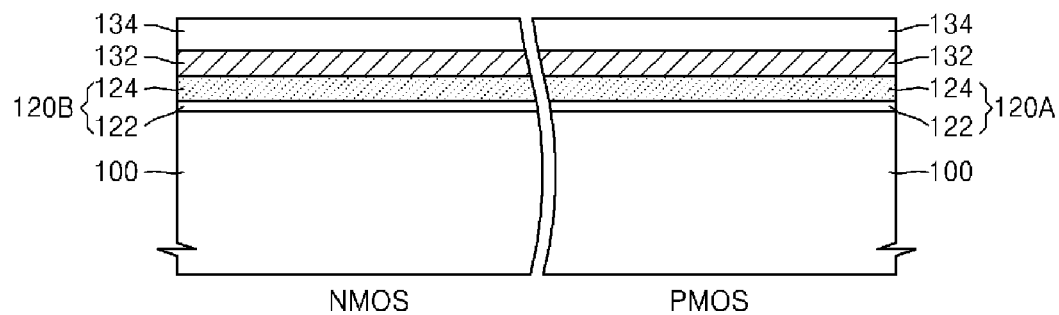

Referring to FIG. 2D, a capping layer 134 is formed on the metal nitride film 132 in the PMOS region and the NMOS region of the semiconductor substrate 100. The capping layer 134 may be a metal film, a metal oxide film or a metal nitride film, including the metal nitride film 132.

For example, the capping layer 134 may be an $Al_2O_3$ film. The capping layer 134 has a thickness within the range of 1~30 Å, based on the device type to be formed. When the capping layer 134 is left within a gate stack structure of the semiconductor device, the capping layer partially constitutes the gate. Therefore, the capping layer 134 is thin enough not to negatively affect the conduction of the gate. The capping layer 134 may be formed from an $Al_2O_3$ film, the formation of which is discussed above with reference to FIG. 2A.

Figure 2E:
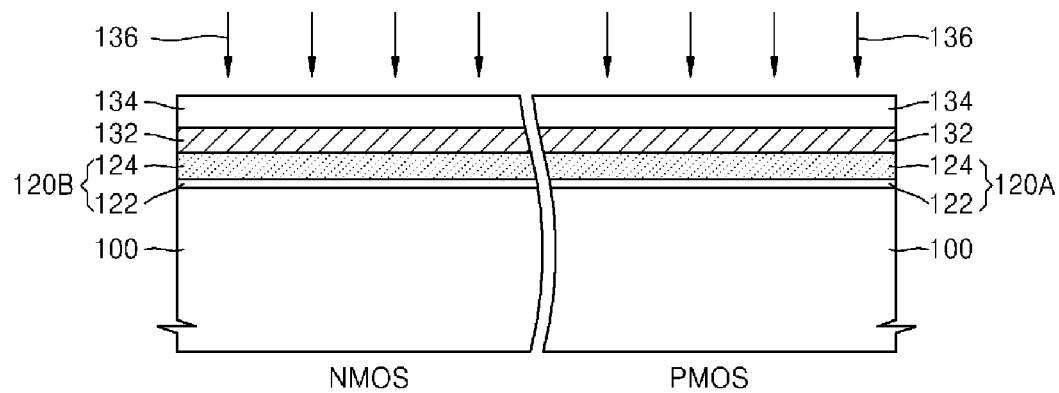

Referring to FIG. 2E, the capping layer 134 is annealed under an ambient 136 of a gas, such as $N_2$, NO, $N_2O$, $NH_3$, $O_2$ or combinations of these gases, or under a vacuum ambient with no supply of gas. The annealing ambient 136 may include nitrogen atoms.

Annealing of the capping layer 136 may be performed at a temperature of 550°~750° C. for one minute or less, for example. When the capping layer 136 is an $Al_2O_3$ film, the capping layer 136 is annealed to improve an etching endurance with respect to a stripper when stripping for removing a photoresist pattern, thereby preventing the consumption of the capping layer 134 exposed after removing the photoresist pattern by the stripper.

Figure 2F:
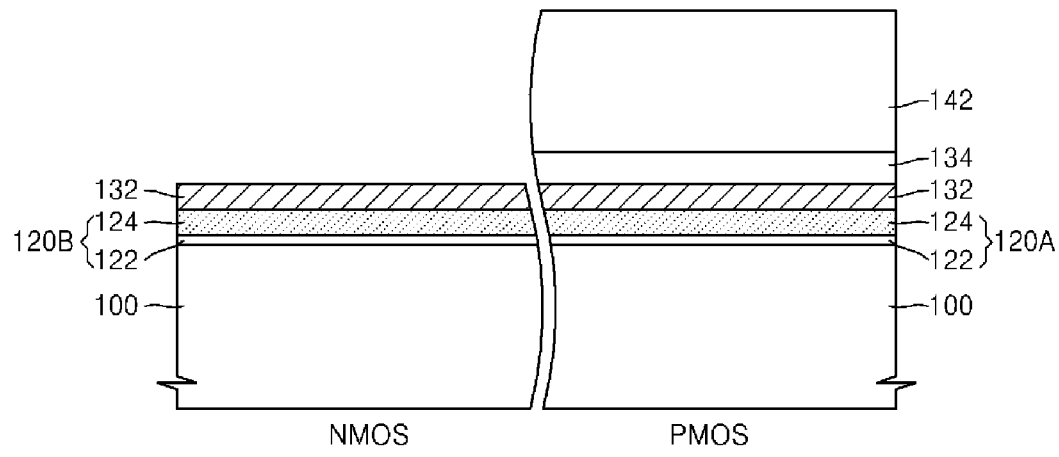

Referring to FIG. 2F, a photoresist pattern 142 covering the capping layer 134 is formed only in the PMOS region, exposing the capping layer 134 in the NMOS region of the semiconductor substrate 100 on which the capping layer 134 is formed. Thereafter, using the photoresist pattern 142 as an etch mask, the capping layer 134 exposed in the NMOS region is wet etched by a cleansing solution containing fluoride (F), and more particularly HF, for example. The HF solution may be diluted to 200:1 or 500:1 to be used as the cleansing solution. After removing the capping layer 134, the metal nitride film 132 is exposed in the NMOS region of the semiconductor substrate 100.

Figure 2G:
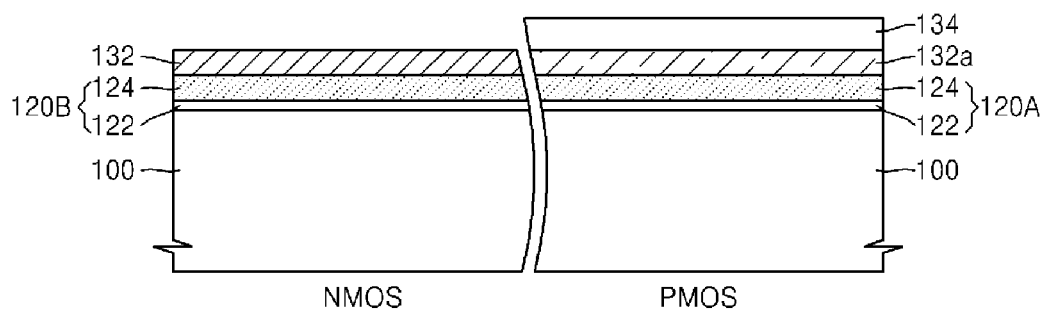

Referring to FIG. 2G, the photoresist pattern 142 is removed by ashing and stripping. In this case, $N_2$ or $H_2$ is used for ashing to remove the photoresist pattern 142. By doing so, the metal nitride film 132 is exposed in the NMOS region of the semiconductor substrate 100, and the capping layer 134 covering the metal nitride film 132 is exposed in the PMOS region. In this case, the capping layer 134 exposed in the PMOS region to the stripping to remove the photoresist pattern 142 is very slightly consumed because the etching endurance with respect to the stripper is increased by the annealing described with reference to FIG. 2E.

Figure 2H:
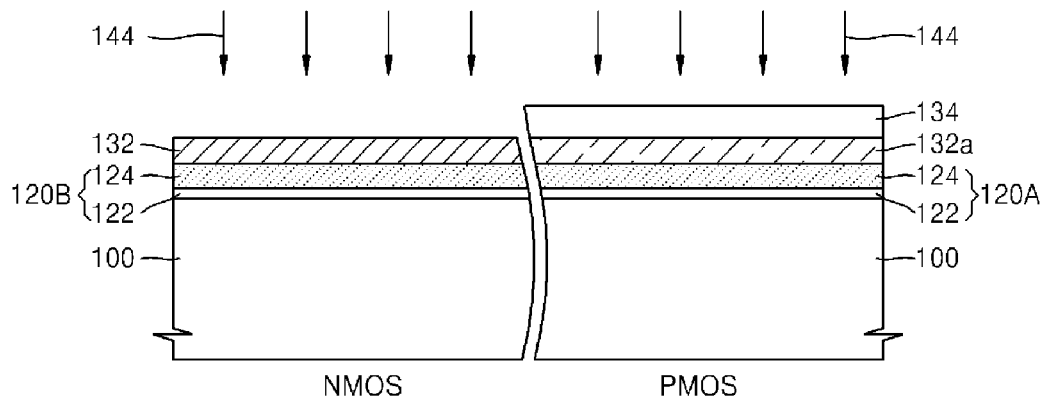

Referring to FIG. 2H, the resultant structure, having the exposed metal nitride film 132 in the NMOS region and the exposed capping layer 134 in the PMOS region, is subjected to thermal treatment 144. As a result, the metal nitride film 132 in the PMOS region is doped with metal from the capping layer 134, obtaining a doped metal nitride film 132a.

The thermal treatment 144 may be performed under an ambient of a gas, such as $N_2$, NO, $N_2O$, $NH_3$, $O_2$ or combinations of these gases. Also, the thermal treatment 144 may be performed at a higher temperature for a longer time than the temperature and the time of annealing of the capping layer 134 described with reference to FIG. 2E. For example, the thermal treatment 144 may be performed at a temperature of 550°~750° C. for 3 seconds to 30 minutes.

For example, when the metal nitride film 132 is composed of TaN and the capping layer 134 is the $Al_2O_3$ film, the doped metal nitride film 132a is a TaN film doped with Al and O. Also, when the metal nitride film 132 is composed of TaN and the capping layer 134 is composed of nitride aluminum, the doped metal nitride film 132a is a TaN film doped with Al and N.

Figure 2I:
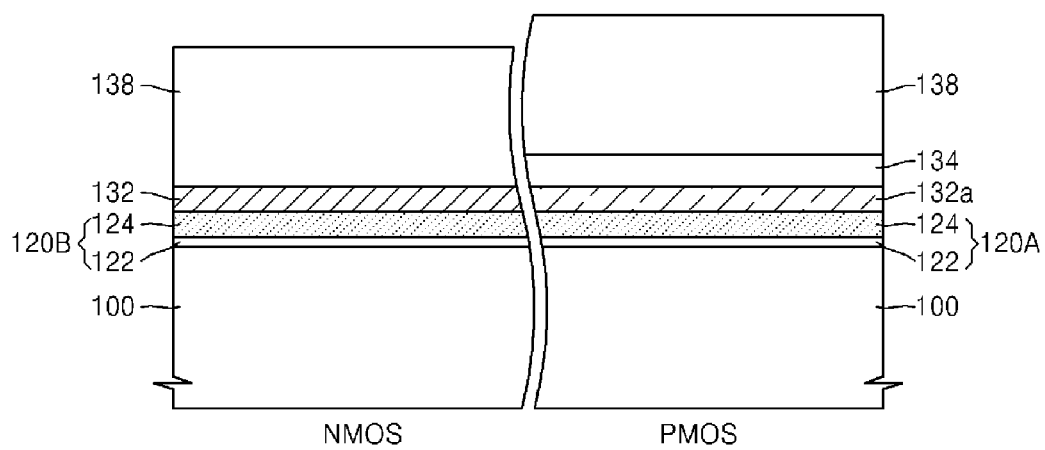

Referring to FIG. 2I, polysilicon is deposited on the metal nitride film 132 and the capping layer 134 when the metal nitride film 132 is exposed in the NMOS region and the capping layer 134 is exposed in the PMOS region, thereby forming a non-conductive polysilicon layer 138. For example, the non-conductive polysilicon layer 138 may have a thickness of about 1000~1500 Å.

Figure 2J:
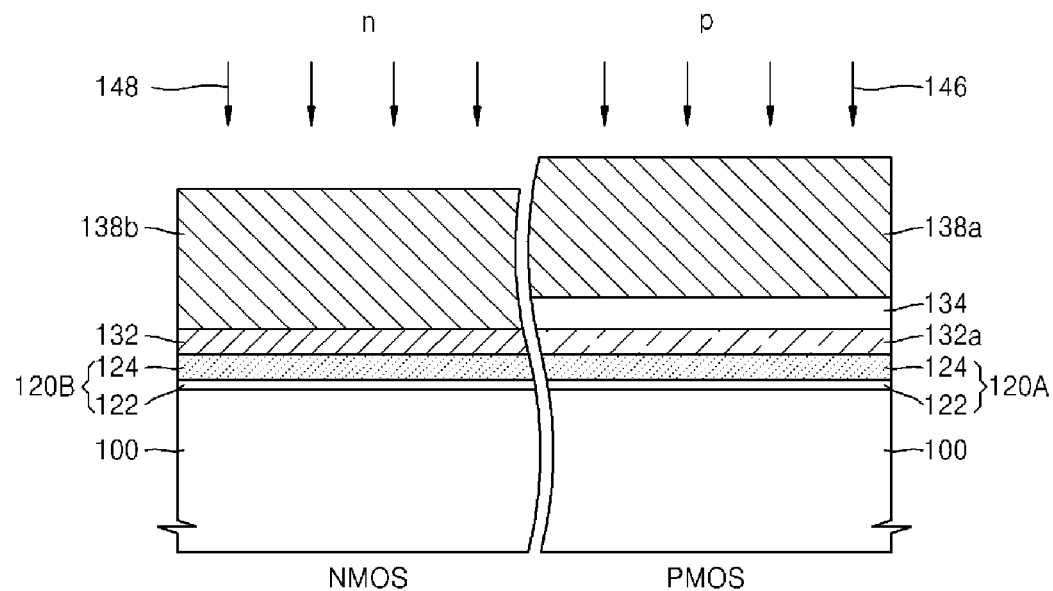

Referring to FIG. 2J, the non-conductive polysilicon layer 138 is doped with a p-type impurity 146, e.g. boron (B), in the PMOS region, and an n-type impurity 148, e.g. phosphorus (P) or arsenic (As), in the NMOS region, thereby forming conductive polysilicon layers 138a and 138b, respectively, in the PMOS region and the NMOS region.

As the result, a stacked structure for a first gate electrode including the doped metal nitride film 132a, the capping layer 134 and the conductive polysilicon layer 138a is obtained in the PMOS region. Also, a stacked structure for a second gate electrode including the metal nitride film 132 and the conductive polysilicon layer 138b is obtained in the NMOS region.

Figure 2K:
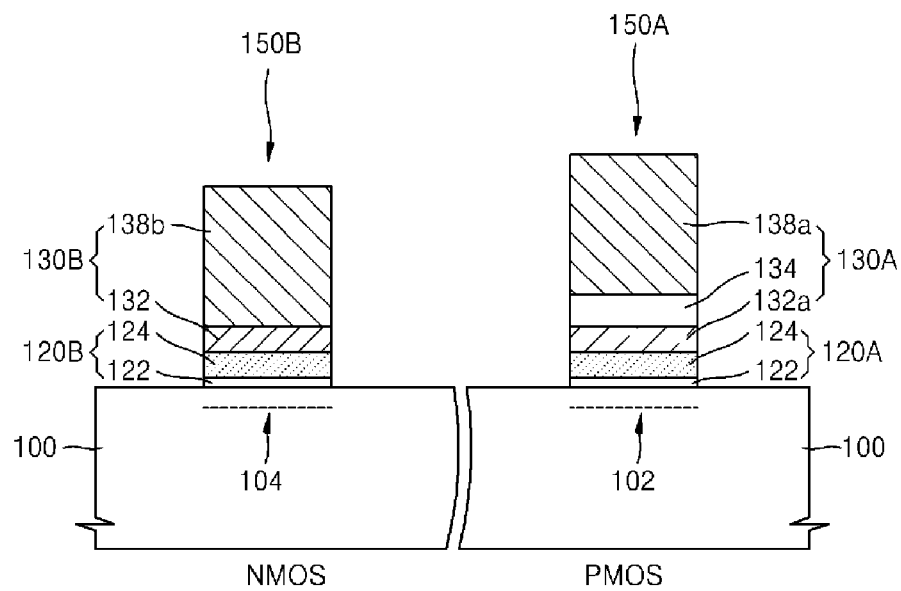

Referring to FIG. 2K, the stacked structures for the first gate electrode and the second gate electrode, and the first gate dielectric film 120A and the second gate dielectric film 120B, respectively located under the stacked structures, are patterned. Thus, a first gate stack structure 150A, formed from the first gate dielectric film 120A and the first gate 130A, is formed on the p-type channel region 102 of the PMOS region to form the PMOS transistor. Similarly, a second gate stack structure 150B, formed of the first gate dielectric film 120B and the second gate 130B, is formed on the n-type channel region 104 in the NMOS region to form the NMOS transistor. The first gate 130A of the first gate stack structure 150A is formed of the doped metal nitride film 132a, the capping layer 134 and the conductive polysilicon layer 138a. Also, the second gate 130B of the second gate stack structure 150B is formed of the metal nitride film 132 and the conductive polysilicon layer 138B. As described above, the different metal gate structures having mutually different gate stack structures according to the channel types are employed to obtain a CMOS transistor having gate electrodes with different work functions in the NMOS transistor and the PMOS transistor.

Moreover, in the first gate stack structure 150A and the second gate stack structure 150B, the doped metal nitride film 132a of the first gate 130A is between the first gate dielectric film 120A and the conductive polysilicon layer 138a, and the metal nitride film 132 of the second gate 130B is between the second gate dielectric film 120B and the conductive polysilicon layer 138b. Therefore, particularly in the PMOS region, penetration of impurities, including boron (B), from the conductive polysilicon layer 138a to the first gate dielectric film 120A is prevented by the doped metal nitride film 132a, which addresses the problem of gate depletion.

FIGS. 3A through 3H are sectional views illustrating a method of manufacturing a semiconductor device according to a second illustrative embodiment of the present invention. In FIGS. 3A through 3H, reference numerals common to FIGS. 2A through 2K denote like elements.

Figure 3A:
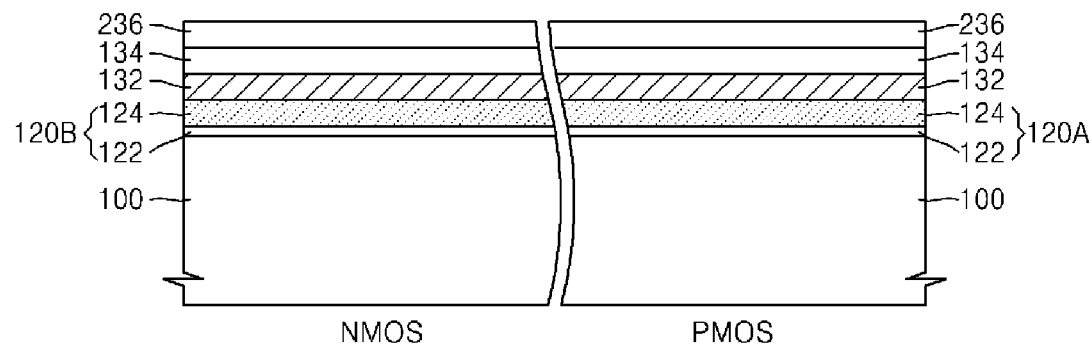
FIGS. 3A through 3H are sectional views illustrating a method of manufacturing a semiconductor device, according to a second exemplary embodiment of the present invention.

Referring to FIG. 3A, as illustrated in FIGS. 2A through 2D, a first gate dielectric film 120A, a metal nitride film 132 and a capping layer 134 are formed in a PMOS region of a semiconductor substrate 100, and a second gate dielectric film 120B, a metal nitride film 132 and a capping layer 134 are formed in an NMOS region. Thereafter, a hard mask layer 236 is formed on the capping layer 134 in the PMOS region and the NMOS region. The hard mask layer 236 may be formed from silicon oxide. For example, Atomic Layer Deposition (ALD) under a relatively low temperature may be performed to form the hard mask layer 236.

Figure 3B:
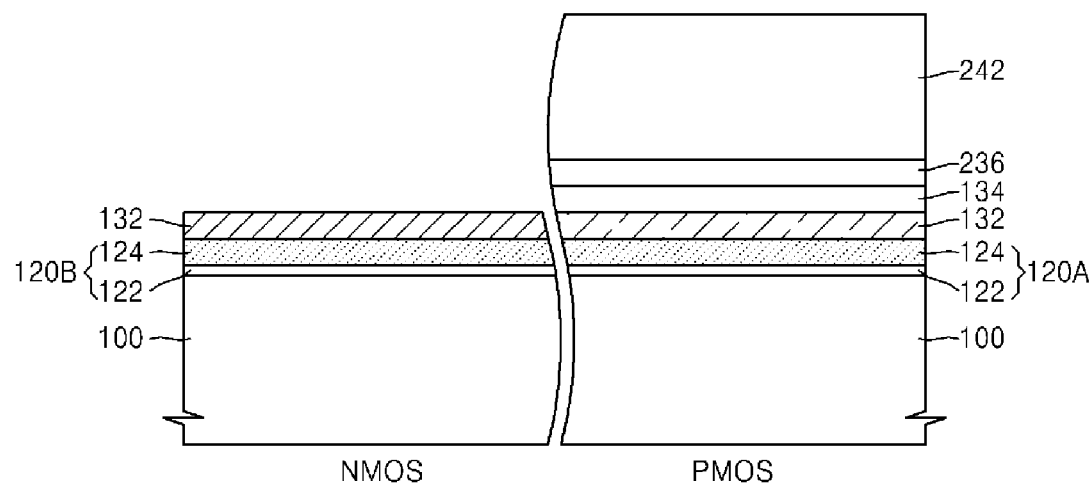

Referring to FIG. 3B, a photoresist pattern 242 covering the hard mask layer 236 only in the PMOS region is formed, exposing the hard mask layer 236 in the NMOS region of the semiconductor substrate 100 on which the hard mask layer 236 is located. Thereafter, using the photoresist pattern 242 as an etch mask, the hard mask layer 236 exposed in the NMOS region and the underlying capping layer 134 are wet etched by a cleansing solution including F, and particularly HF, for example. The cleansing solution may be a diluted HF solution of 200:1 or 500:1, for example. After removing the hard mask layer 236 and the capping layer 134 in the NMOS region, the metal nitride film 132 is exposed in the NMOS region of the semiconductor substrate 100.

Figure 3C:
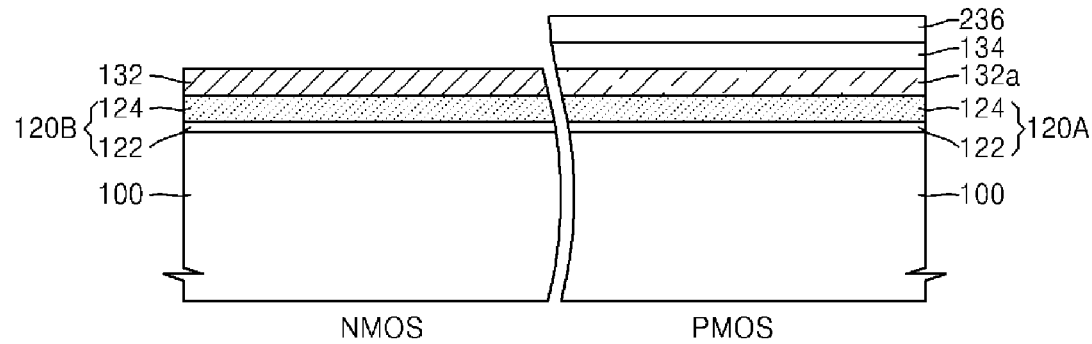

Referring to FIG. 3C, the photoresist pattern 242 is removed by ashing and stripping. By doing so, the metal nitride film 132 is exposed in the NMOS region of the semiconductor substrate 100, and the hard mask layer 236 covering the capping layer 134 is exposed in the PMOS region.

Figure 3D:
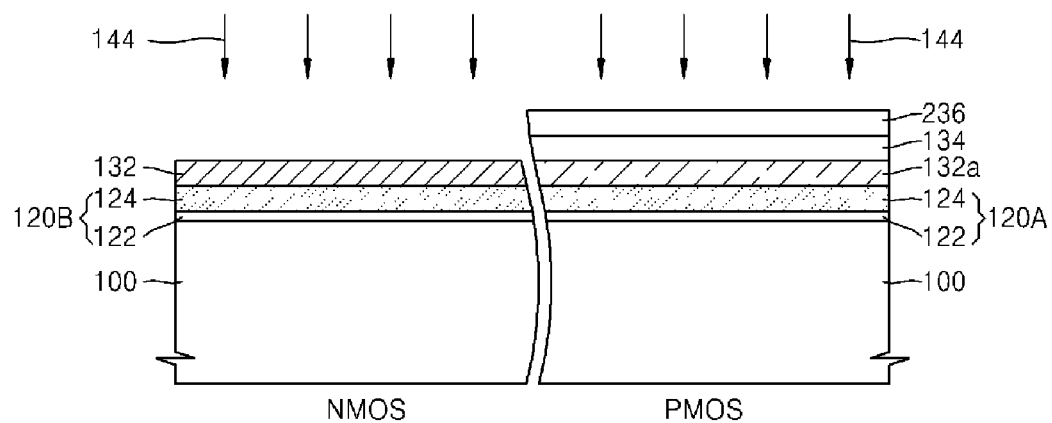

Referring to FIG. 3D, as described with reference to FIG. 2H, the resultant structure on which the metal nitride film 132 is exposed in the NMOS region and the hard mask layer 236 is exposed in the PMOS region is subjected to thermal treatment 144. Thus, the metal nitride film 132 in the PMOS region is doped with metal included in the capping layer 134 to obtain a doped metal nitride film 132a.

Figure 3E:
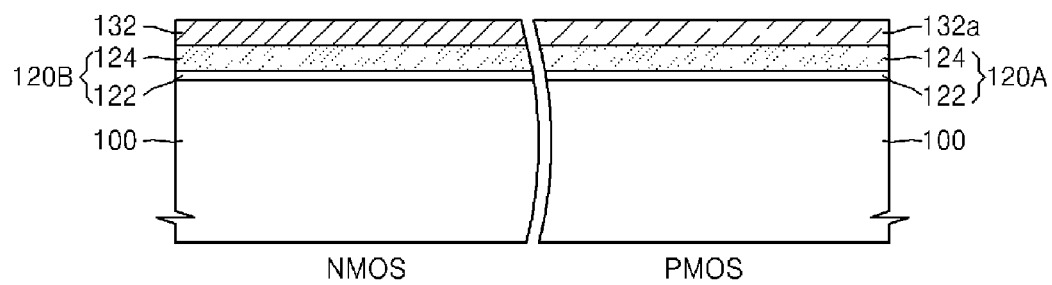

Referring to FIG. 3E, the hard mask layer 236 removed from the resultant structure on which the doped metal nitride film 132a is formed. When the hard mask layer 236 is formed from silicon oxide, for example, the hard mask layer 236 may be wet etched by a cleansing solution containing fluoride (F), and more particularly HF. The cleansing solution may be a HF solution diluted to 200:1 or 500:1, for example. In this case, when the capping layer 134 is an $Al_2O_3$ film, the capping layer 134 may also be removed while removing the hard mask layer 236, because the $Al_2O_3$ film can be removed by the cleansing solution containing fluoride. FIG. 3E illustrates the case where the capping layer 134 is removed together with the hard mask layer 236 to expose the doped metal nitride film 132a in the PMOS region.

Figure 3F:
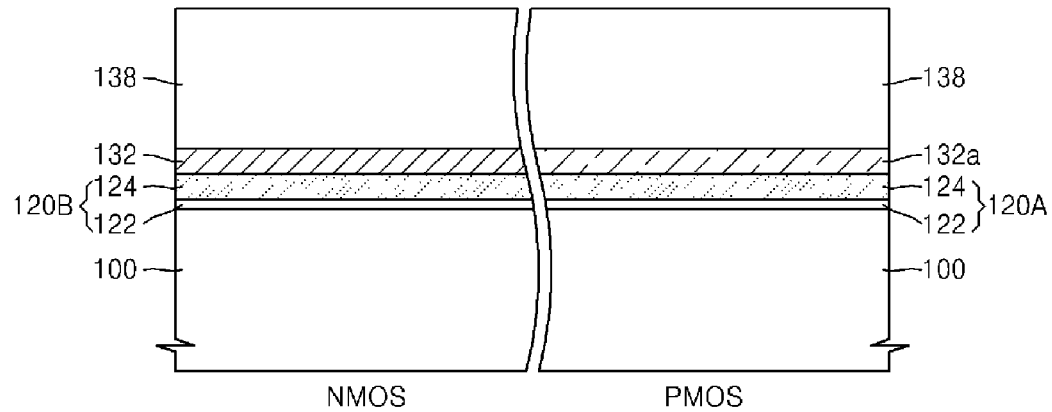

Referring to FIG. 3F, while the metal nitride film 132 is exposed in the NMOS region and the doped metal nitride film 132a is exposed in the PMOS region, polysilicon is deposited on both the metal nitride film 132 and the doped metal nitride film 132a to form a non-conductive polysilicon layer 138 as described with reference to FIG. 2I.

Figure 3G:
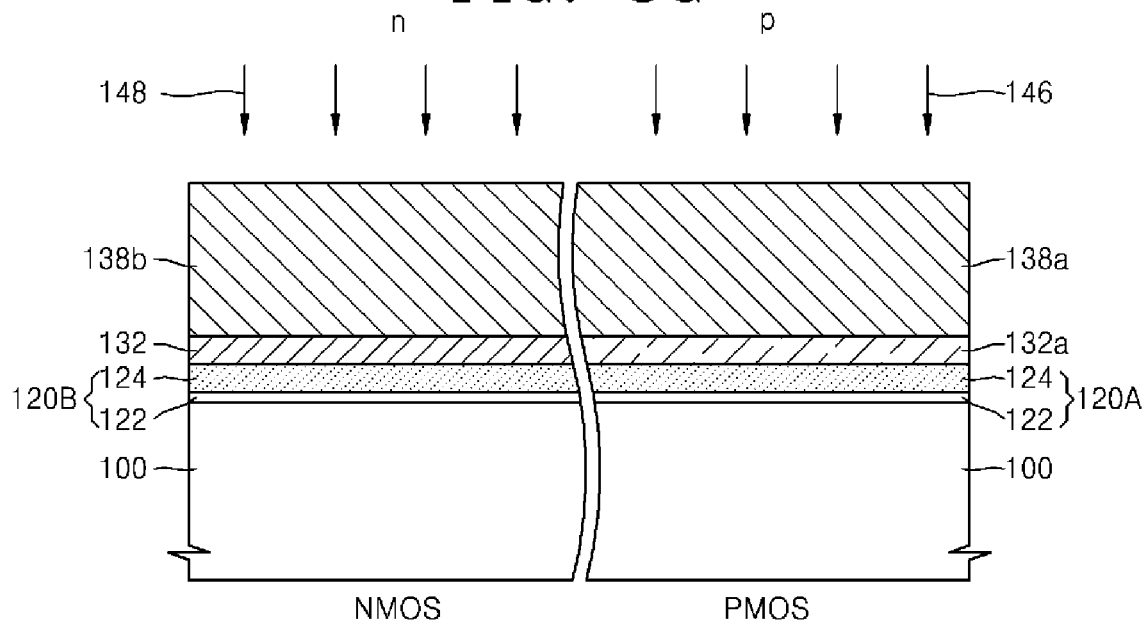

Referring to FIG. 3G, as described with reference to FIG. 2J, the non-conductive polysilicon layer 138 is doped with a p-type impurity 146, e.g., boron (B), in the PMOS region, and an n-type impurity 148, e.g., phosphorus (P) or arsenic (As), in the NMOS region, thereby forming conductive polysilicon layers 138a and 138b respectively in the NMOS region and the PMOS region.

As a result, a stacked structure for a first gate electrode consisting of the doped metal nitride film 132a and the conductive polysilicon layer 138a is obtained in the PMOS region. Similarly, a stacked structure for a second gate electrode consisting of the metal nitride film 132 and the conductive polysilicon layer 138b is obtained in the NMOS region.

Figure 3H:
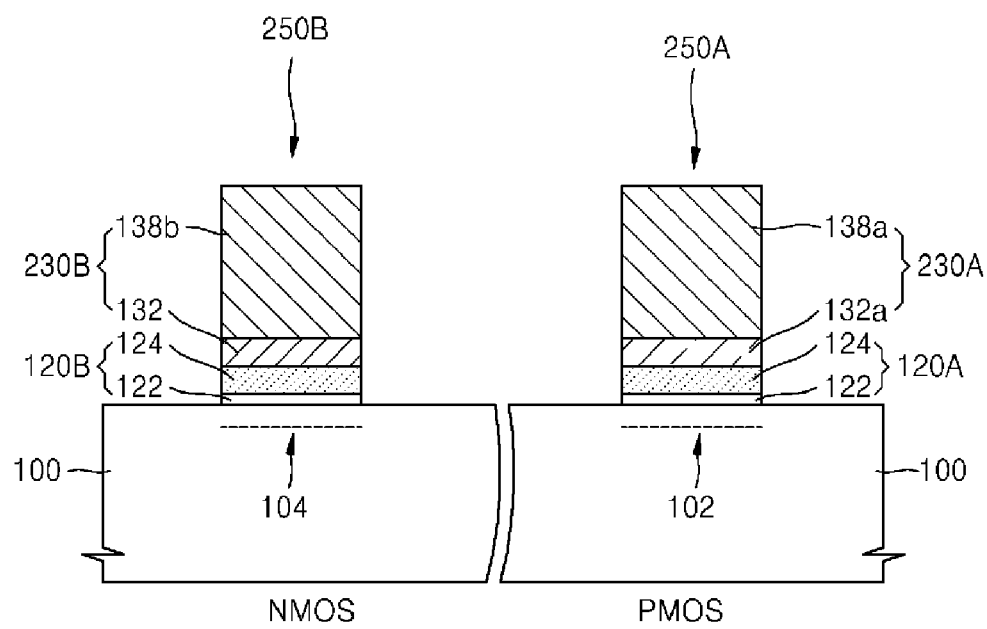

Referring to FIG. 3H, as described with reference to FIG. 2K, the stacked structures for the first gate electrode and the second gate electrode, and the first gate dielectric film 120A and the second gate dielectric film 120B respectively located under the stacked structures, are patterned. Thus, a first gate stack structure 250A formed of the first gate dielectric film 120A and the first gate 230A is formed on the p-type channel region 102 of the PMOS region to form the PMOS transistor. Similarly, a second gate stack structure 250B formed of the first gate dielectric film 120B and the second gate 230B is formed on the n-type channel region 104 in the NMOS region to form the NMOS transistor. The first gate 230A of the first gate stack structure 250A is formed from the doped metal nitride film 132a and the conductive polysilicon layer 138a. Also, the second gate 230B of the second gate stack structure 250B is formed from the metal nitride film 132 and the conductive polysilicon layer 138B. As described above, different metal gate structures having different gate stack structures according to the channel types may be employed to obtain a CMOS transistor having gate electrodes with different work functions in the NMOS transistor and the PMOS transistor.

The doped metal nitride film 132a of the first gate 230A is between the first gate dielectric film 120A and the conductive polysilicon layer 138a in the first gate stack structure 250A, and the metal nitride film 132 of the second gate 230B is between the second gate dielectric film 120B and the conductive polysilicon layer 138b. Therefore, particularly in the PMOS region, penetration of impurities, including boron (B), from the conductive polysilicon layer 138a to the first gate dielectric film 120A is prevented by the doped metal nitride film 132a, which addresses the problem of prevent gate depletion.

Comparative Example

Figure 4:
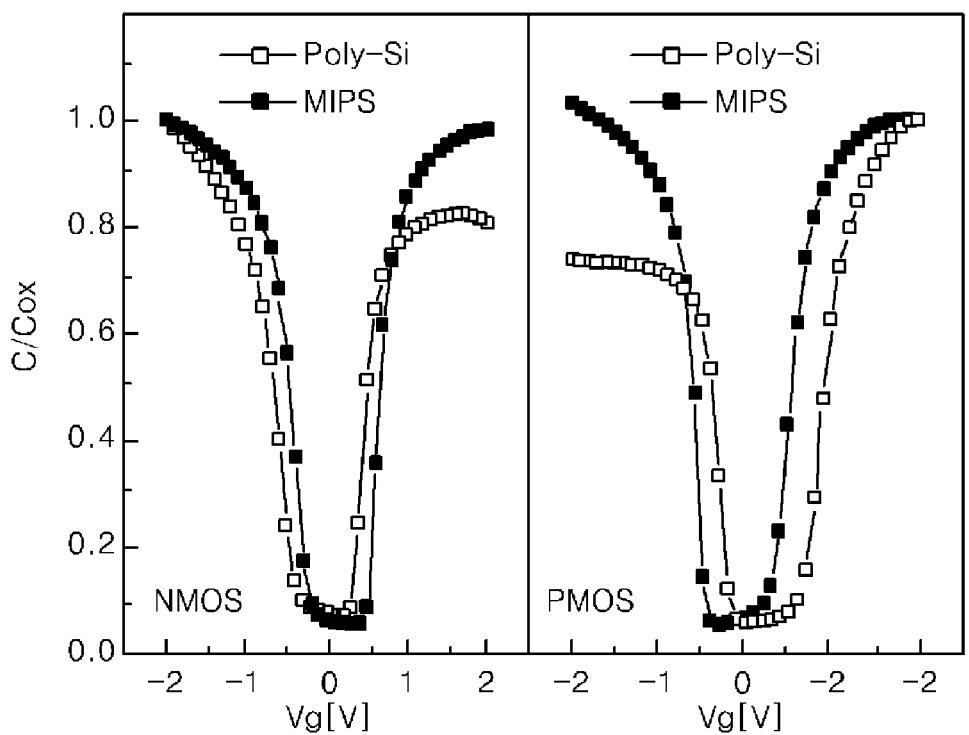
FIG. 4 are graphs comparing C-V characteristics of transistors having different gates in a semiconductor device of a comparative example.

FIG. 4 shows graphs comparing C-V characteristics of transistors having a gate consisting of a single polysilicon layer (poly-si) (--□--) and a metal gate consisting of a stacked structure of TaN/polysilicon (MIPS) (--■--) in a semiconductor device of a comparative example. In the evaluation example of FIG. 4, the gate dielectric film was HfSiON film in each case.

As shown in FIG. 4, when a metal inserted polysilicon (MIPS) gate structure was obtained by inserting TaN between a high-k HfSiON gate dielectric film and the polysilicon layer (--■--), the gate depletion problem occurring when forming the polysilicon layer directly on the high-k film was solved (--□--).

However, as can be noted in FIG. 4, because the work function corresponded to the metal nitride film when the metal nitride film was inserted between the polysilicon layer and the high-k film, a threshold voltage Vth shifted in comparison to the gate composed of the single polysilicon layer (--□--). Accordingly, when the metal nitride film is inserted between the polysilicon layer and the high-k film, it is difficult to supply the threshold voltage Vth demanded in the NMOS transistor and the PMOS transistor.

Evaluation Example

Figure 5:
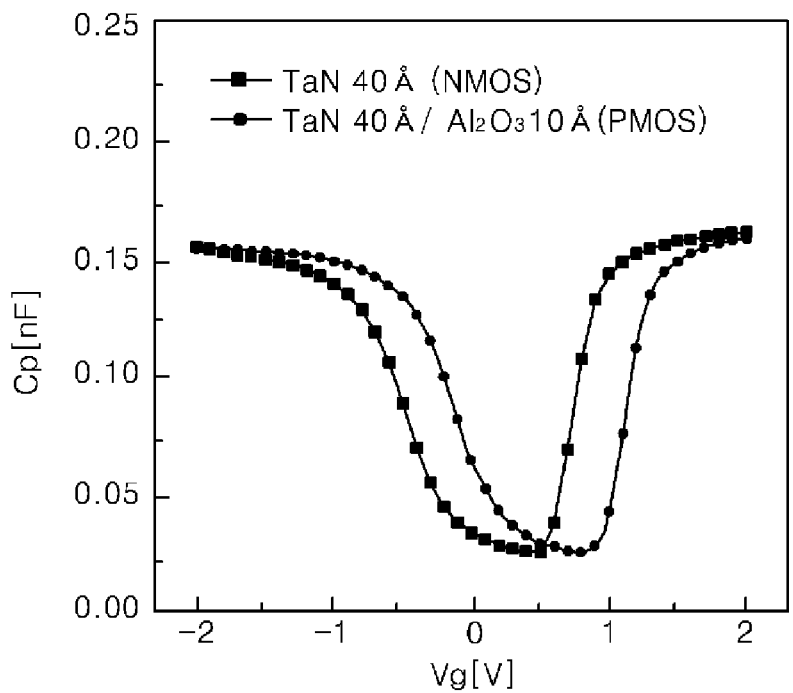
FIG. 5 is a graph of C-V characteristics of an NMOS transistor and a PMOS transistor in a semiconductor device, according to an exemplary embodiment of the present invention.

FIG. 5 is a graph of the C-V characteristics of the NMOS transistor and the PMOS transistor in the semiconductor device, according to an illustrative embodiment of the present invention, having different metal gate structures according to the channel types of the MOS transistors.

In this example, the gate dielectric films were composed of $SiO_2$ in the NMOS transistor and the PMOS transistor. A gate composed of a TaN film having a thickness of 40 Å and a polysilicon layer was formed in the NMOS transistor, and a gate composed of a TaN film having a thickness of 40 Å doped with aluminum and oxygen, an $Al_2O_3$ film having a thickness of 10 Å, and a polysilicon layer was formed in the PMOS transistor.

As shown in FIG. 5, the flatband voltage $V_{FB}$ of the NMOS transistor was −0.52 V, and the flatband voltage $V_{FB}$ of the PMOS transistor was −1.17V.

As can be noted in the result depicted in FIG. 5, there is no great difference in capacitance Cp between the cases of TaN film and TaN/$Al_2O_3$ film. Accordingly, an equivalent oxide film thickness Tox is not increased by forming the $Al_2O_3$ film on the TaN film. Furthermore, as plotted in the graphs of FIG. 5, the PMOS transistor is shifted by about 350 mV in a positive direction, as compared to the NMOS transistor. This phenomenon occurs when the $Al_2O_3$ film is diffused into TaN and piled up within the $SiO_2$ film and the TaN film causing Fermi level pinning effect. Consequently, the PMOS transistor has a more favorable work function, or the Fermi level pinning suitable for PMOS transistor can be affected.

The structure of the high-k film/the TaN film/the polysilicon layer is formed in the NMOS transistor, and the structure of the high-k film/the Al-doped TaN film/the polysilicon layer is formed in the PMOS transistor. Thus, the different metal gate structures are formed in the NMOS and the PMOS transistors each having different work functions, to provide reliable and optimum operational characteristics.

A semiconductor device, according to embodiments of the present invention, employs different metal gate structures, each independently formed in the NMOS transistor and the PMOS transistor, to obtain optimum threshold voltages in the NMOS transistor and the PMOS transistor, when fabricating a CMOS device using a high-k film as a gate dielectric film of the transistors. Since the metal gate electrodes have mutually different structures in the NMOS transistor and the PMOS transistor, electrodes with different work functions can be formed in the NMOS transistor and the PMOS transistor, and the respective target threshold voltages (Vt) can be easily obtained in the NMOS transistor and the PMOS transistor. The semiconductor device thus has a gate electrode structure, which prevents problems caused by gate depletion or dopant diffusion from a gate electrode in a transistor using a high dielectric constant film as a gate dielectric film, and secures a normal threshold voltage in both the NMOS transistor and the PMOS transistor, to optimize operational characteristics.

Also, in a method of manufacturing the semiconductor device, according to embodiments of the present invention, when forming respective gate dielectric films of the NMOS transistor and the PMOS transistor using different kinds of high-k films, a metal nitride film is inserted between a polysilicon layer constituting a gate and a gate dielectric film to solve the problem of a dopant intruding in a PMOS region, and simultaneously, the gate depletion problem in an NMOS region and the PMOS region. Moreover, the metal nitride film of the gate electrode is doped with a different metal than that of the metal nitride film, and different metals are used as doping metals according to channel types of the NMOS transistor and the PMOS transistor. By doing so, the gate electrode having different work functions according to the channel types of the transistors can be embodied, and appropriate threshold voltages (Vt) can be easily obtained according to the channel types of the transistors. Therefore, when manufacturing a highly integrated semiconductor device using the high-k gate dielectric film, the gate dielectric film is reliable. Furthermore, the normal threshold voltages (Vt) can be secured in both NMOS transistor and the PMOS transistor, to optimize the semiconductor device operational characteristics.

While the present invention has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A semiconductor device comprising:
   a first MOS transistor having a first channel region of a first conductivity type on a semiconductor substrate, a first gate dielectric film on the first channel region, a first gate including a first metal nitride film on the first gate dielectric film, and a first conductive polysilicon layer; and
   a second MOS transistor having a second channel region of a second conductivity type on the semiconductor substrate, a second gate dielectric film on the second channel region, a second gate including a second metal nitride film having a composition different from the first metal nitride film on the second gate dielectric film, and a second conductive polysilicon layer,
   wherein the second metal nitride film is a TaN film doped with a lanthanum-based element.

2. The semiconductor device of claim 1, wherein the first MOS transistor is a PMOS transistor and the second MOS transistor is an NMOS transistor; and
   the first gate dielectric film and the second gate dielectric film have the same structure.

3. The semiconductor device of claim 1, wherein the first gate dielectric film and the second gate dielectric film each comprise:
   an interface layer positioned directly on the channel region, and comprising a low dielectric constant film having a first dielectric constant; and
   a high dielectric constant film on the interface layer, and having a second dielectric constant greater than the first dielectric constant.

4. The semiconductor device of claim 3, wherein the interface layer is a silicon oxide film, a silicon oxynitride film, a silicate film or combinations of these films, and the high dielectric constant film is composed of $HfO_2$, $Al_2O_3$ or combinations of these materials.

5. The semiconductor device of claim 1, wherein the first metal nitride film is a TaN film doped with a first element comprising aluminum and a second element comprising at least one of oxygen and nitride.

6. A semiconductor device comprising:
   a first MOS transistor having a first channel region of a first conductivity type on a semiconductor substrate, a first gate dielectric film on the first channel region, a first gate including a first metal nitride film on the first gate dielectric film, and a first conductive polysilicon layer; and
   a second MOS transistor having a second channel region of a second conductivity type on the semiconductor substrate, a second gate dielectric film on the second channel region, a second gate including a second metal nitride film having a composition different from the first metal nitride film on the second gate dielectric film, and a second conductive polysilicon layer,
   wherein the first MOS transistor is a PMOS transistor and the second MOS transistor is an NMOS transistor, and
   wherein the second metal nitride film is a TaN film doped with a lanthanum-based element.

7. The semiconductor device of claim 6, wherein the first metal nitride film is a TaN film doped with a first element comprising aluminum and a second element comprising at least one of oxygen and nitride.

8. The semiconductor device of claim 7, wherein the first gate further comprises a metal containing capping layer interposed between the first metal nitride film and the first conductive polysilicon layer.

* * * * *